United States Patent [19]
Miller et al.

[11] Patent Number: 5,202,820
[45] Date of Patent: Apr. 13, 1993

[54] SATURABLE INDUCTOR PROTECTION CIRCUIT FOR INDUCTIVE LOAD DRIVER

[75] Inventors: John M. Miller, Saline, Mich.; Fenton L. Rees, Everett, Wash.

[73] Assignee: Ford Motor Company, Dearborn, Mich.

[21] Appl. No.: 807,250

[22] Filed: Dec. 16, 1991

[51] Int. Cl.$^5$ .......................................... H02M 7/5395
[52] U.S. Cl. ........................................ 363/56; 363/132
[58] Field of Search ........................... 363/41, 56, 132; 318/811

[56] References Cited

U.S. PATENT DOCUMENTS

| | | | |
|---|---|---|---|
| 4,442,479 | 4/1984 | Makimaa | 363/136 |
| 4,626,715 | 12/1986 | Ishii | 307/585 |
| 4,825,132 | 4/1989 | Gritter | 318/811 |
| 4,926,302 | 5/1990 | Harada et al. | 363/132 |
| 5,107,151 | 4/1992 | Cambier | 307/570 |

FOREIGN PATENT DOCUMENTS

| | | | |
|---|---|---|---|
| 3234602 | 3/1984 | Fed. Rep. of Germany | 363/132 |
| 1-25018 | 5/1989 | Japan | 363/56 |

*Primary Examiner*—William H. Beha, Jr.
*Attorney, Agent, or Firm*—Mark L. Mollon; Roger L. May

[57] ABSTRACT

Methods and apparatus are disclosed for relieving stresses related to reverse recovery of free-wheeling diodes of power inverter circuits used to drive inductive loads by utilizing saturating inductors which are connected between switching transistors of the inverter circuit and the inductive load. Circuit elements are also connected to the switching devices of the inverter circuits for initially conducting free-wheeling current through an inductive load upon the turn-off of an inverter transistor.

10 Claims, 3 Drawing Sheets

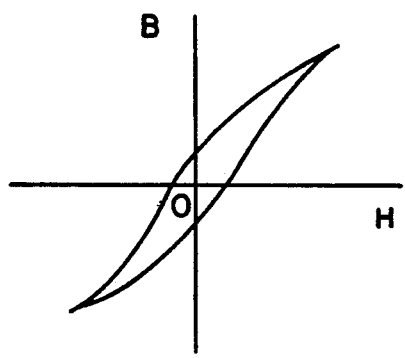
FIG. 6
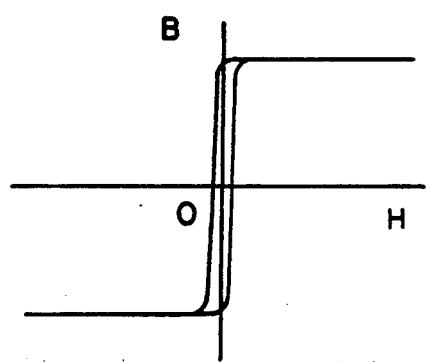
FIG. 7
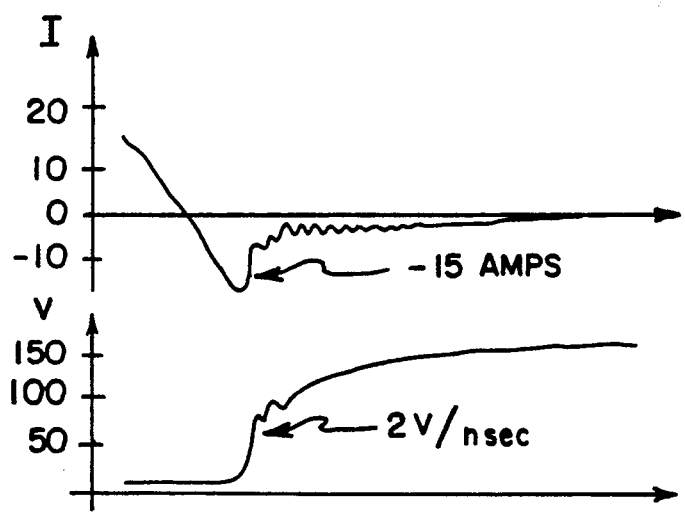
FIG. 8
FIG. 9
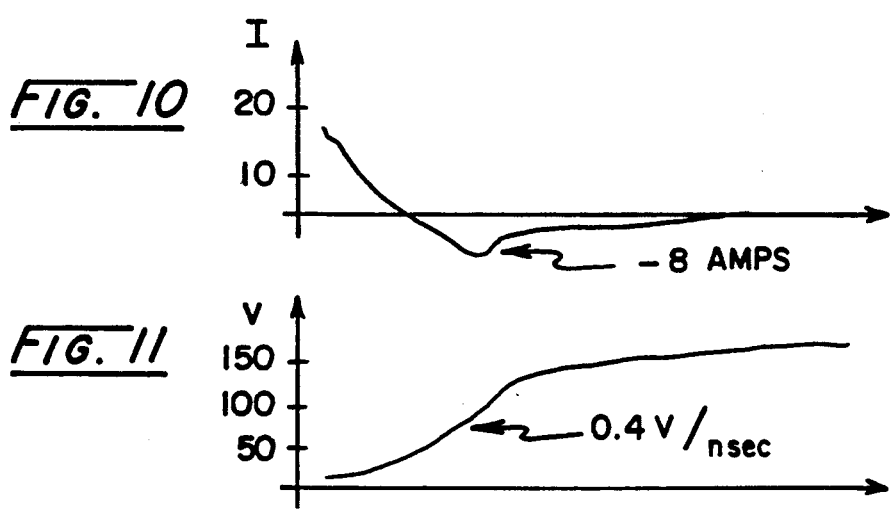
FIG. 10
FIG. 11

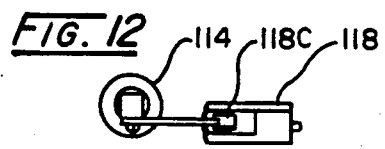
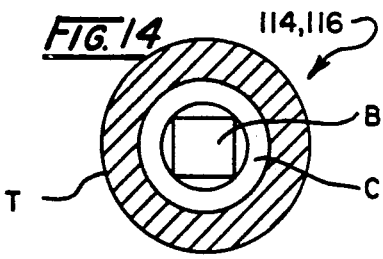
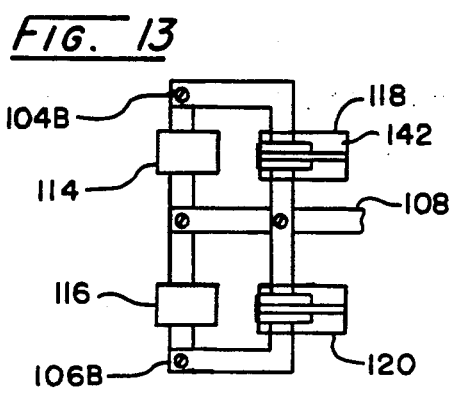
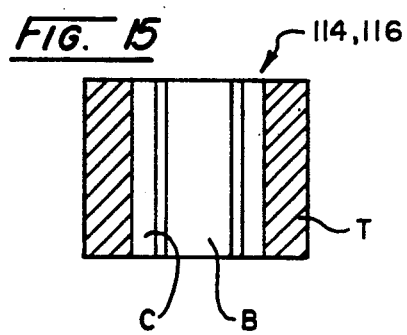
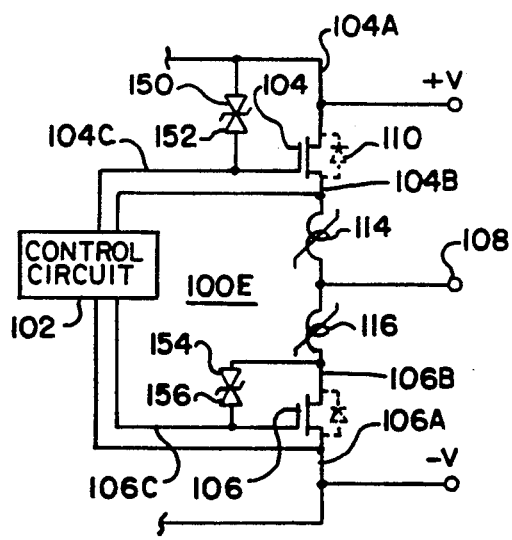
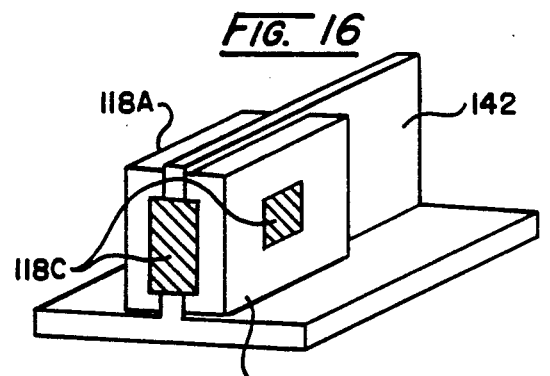
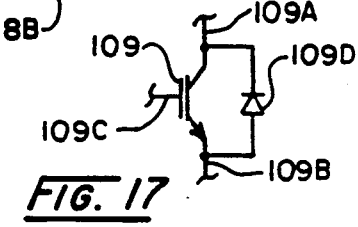

SATURABLE INDUCTOR PROTECTION CIRCUIT FOR INDUCTIVE LOAD DRIVER

BACKGROUND OF THE INVENTION

The present invention relates generally to circuits for driving inductive loads and, more particularly, to a method and apparatus for driving inductive loads wherein stresses induced on switching devices used in drive circuits are reduced with resultant improvements in device reliability, system electrical noise and current sensing relative to the loads. While the present invention is generally applicable to inductive load drive circuits, it is particularly applicable to pulse width modulated (PWM) inverter systems for driving alternating current (AC) motors and accordingly will be described with reference to that application.

For operation of an AC motor from a direct current (DC) power source, a pulse width modulated (PWM) inverter system may be used to convert the DC power to AC power for operating the motor. An AC waveform is constructed by the inverter by alternately connecting a positive power bus and a negative power bus to the motor in accordance with prescribed PWM signals to construct a desired AC waveform. See, for example, U.S. Pat. No. 4,825,132 which issued to Gritter and illustrates a three-phase pulse width modulated inverter circuit used for motor control. As illustrated in the, Gritter patent, the inverter circuit includes discrete free-wheeling diodes which are connected in back-to-back relationship with inverter transistors to maintain current flow in the motor whenever an inverter transistor is turned off. While discrete free-wheeling diodes are required for bipolar inverter transistors, if MOSFET devices are used as the inverter transistors, free-wheeling body diodes are inherently included within the structure of the MOSFET devices.

A problem arises, especially when PWM is used, if the free-wheeling diodes have a long reverse recovery time, which is characteristic of the body diodes inherent in MOSFET devices. The long reverse recovery time of the free-wheeling diodes results in large transient current peaks which can be a source of electrical noise. Electron irradiation of power MOSFET devices has been used to improve the characteristics of the body diodes. However, even with such irradiation, the reverse recovery effects of the body diodes are substantial and remain as a problem. Further, the voltage applied to the motor changes levels very rapidly which can also be a possible source of electrical noise.

It is possible to at least partially overcome the long reverse recovery times of the MOSFET body diodes by using Schottky diodes in series with MOSFET power transistors and discrete fast recovery diodes connected as shown in Gritter. Unfortunately, such arrangements add two additional components to each MOSFET power transistor, which components must be sized and packaged to handle substantial power levels. Further, the Schottky diodes add to the power loses in the circuits and these additional losses are substantial particularly at high current levels commonly encountered in power inverter circuits.

Power loss problems are also created by the long recovery times typical of inherent MOSFET body diodes when used in Class-D audio power amplifiers as described in U.S. Pat. No. 4,626,715 issued to Ishii. In the Ishii patent, the power loss problems are overcome by means of inductors which are connected between the outputs of the amplifier drive transistors and the load, and diodes which are connected between the load and the power sources for the amplifier. The inductors of the power amplifier circuit of Ishii are operated in a non-saturating mode over the operating range of the amplifier and are noted as being sufficiently small that ordinary circuit operation is not affected. While such inductors are satisfactory for use in Class-D audio power amplifiers, their use in a power inverter circuit such as used to drive AC motors is unacceptable.

Accordingly, the problems associated with the reverse recovery times of free-wheeling diodes used in inverter circuits, and particularly the long reverse recovery times characteristic of inherent body diodes of MOSFET power transistors used as the free-wheeling diodes in inverter circuits which include such transistors, remain.

A need thus exists for reducing the stresses induced on switching devices of power inverter circuits which drive inductive loads during reverse recovery of free-wheeling diodes of the power inverter circuits and the concurrent electrical noise and current sensing problems.

SUMMARY OF THE INVENTION

This need is met by the method and apparatus of the present invention wherein the stresses related to reverse recovery of free-wheeling diodes of power inverter circuits used to drive inductive loads are relieved by means of saturating inductors which are connected between the switching transistors of the inverter circuits and the inductive loads. Circuit elements are also connected to the switching devices of the inverter circuits for initially conducting free-wheeling current through the inductive loads upon the turn-off of inverter transistors within the circuits.

In accordance with one aspect of the present invention, a drive circuit for inductive loads comprises first and second switching devices. The first switching device has a first power input terminal connected to a positive power bus, a first output terminal and a first control terminal for receiving a switching signal controlling the conduction of power from the first power input terminal to the first output terminal. The second switching device has a second power input terminal connected to a negative power bus, a second power output terminal and a second control terminal for receiving a switching signal controlling the conduction of power from the second power input terminal to the second power output terminal. A drive terminal connects the drive circuit to a load. A first saturable inductor is connected between the first power output terminal and the drive terminal, and a second saturable inductor is connected between the second power output terminal and the drive terminal. Free-wheeling means are connected to the first and second switching devices for initially conducting free-wheeling current through the load upon termination of conduction of the first and second switching devices.

Preferably the first and second switching devices comprise power MOSFET devices; however, they may also comprise bipolar transistor devices with discrete diodes connected in back-to-back relationship with the bipolar transistor devices. The first and second saturable inductors are sized to saturate for standard current levels within the drive circuit but remain unsaturated during reverse recovery of discrete diodes or body diodes inherently included within the structure of the MOSFET devices. The free-wheeling means may take a number of forms. Preferably, the free-wheeling means comprises a first diode connected in parallel with the first saturable inductor and having an anode connected to the drive terminal and a cathode connected to the first power output terminal and a second diode connected in parallel with the second saturable inductor and having a cathode connected to the drive terminal and an anode connected to the second power output terminal.

The free-wheeling means may also comprise: a first diode having a cathode connected to the first power output terminal and an anode connected to the negative power bus and a second diode having an anode connected to the second power output terminal and a cathode connected to the positive power bus; a first zener diode having an anode connected to the positive power bus and a cathode, a second zener diode having an anode connected to the first power output terminal and a cathode connected to the cathode of the first zener diode, a third zener diode having an anode connected to the negative power bus and a cathode, and a fourth zener diode having an anode connected to the second power output terminal and a cathode connected to the cathode of the third zener diode; a first diode having a cathode connected to the first power output terminal and an anode, a first zener diode having an cathode connected to the negative power bus and an anode connected to the anode of the first diode, a second diode having a cathode connected to the positive power bus and an anode, and a second zener diode having a cathode connected to the second power output terminal and an anode connected to the anode of the second diode; and a first zener diode having an anode connected to the first power input terminal and a cathode, a second zener diode having an anode connected to the first control terminal and a cathode connected to the cathode of the first zener diode, a third zener diode having an anode connected to the second power output terminal and a cathode, and a fourth zener diode having an anode connected to the second control terminal and a cathode connected to the cathode of the third zener diode.

In accordance with another aspect of the present invention, a method for reducing stress on switching devices in a drive circuit for inductive loads comprising first and second MOSFET switching devices which connect positive and negative power buses, respectively, to an inductive load comprises the steps of: connecting a first saturable inductor in series between an output terminal of the first MOSFET power switching device and a drive terminal connected to the inductive load; connecting a second saturable inductor in series between an output terminal of the second MOSFET power switching device and the drive terminal connected to the inductive load; and, coupling free-wheeling means to the first and second MOSFET power switching devices for initial conduction of free-wheeling current through the inductive load upon turn-off of the first and second switching devices.

The step of coupling free-wheeling means to the first and second MOSFET power switching devices may comprise a variety of substeps. Preferably, the step of coupling freewheeling means to the first and second MOSFET power switching devices comprises the steps of: connecting an anode of a first diode to the drive terminal; connecting a cathode of the first diode to the output terminal of the first MOSFET power switching device; connecting a cathode of a second diode to the drive terminal; and, connecting an anode of the second diode to the output terminal of the second MOSFET power switching device.

The step of coupling free-wheeling means to the first and second MOSFET power switching devices may also comprise the steps of: connecting an anode of a first diode to the negative power bus; connecting a cathode of the first diode to the output terminal of the first MOSFET power switching device; connecting an anode of a second diode to the output terminal of the second MOSFET power switching device; and, connecting a cathode of the second diode to the positive power bus.

The step of coupling free-wheeling means to the first and second MOSFET power switching devices may alternately comprise the steps of: connecting an anode of a first zener diode to the positive power bus; connecting an anode of a second zener diode to the output terminal of the first MOSFET power switching device; connecting the cathode of the first zener diode to the cathode of the second zener diode; connecting an anode of a third zener diode to the negative power bus; connecting an anode of a fourth zener diode to the output terminal of the second MOSFET power switching device; and, connecting the cathode of the third zener diode to the cathode of the fourth zener diode.

The step of coupling free-wheeling means to the first and second MOSFET power switching devices may comprise the steps of: connecting a cathode of a first diode to the output terminal of the first MOSFET power switching device; connecting a cathode of a first zener diode to the negative power bus; connecting an anode of the first diode to the anode of the first zener diode; connecting a cathode of a second diode to the positive power bus; connecting a cathode of a second zener diode to the output terminal of the second MOSFET power switching device; and, connecting the anode of the second diode to the anode of the second zener diode.

Finally, the step of coupling free-wheeling means to the first and second MOSFET power switching devices may comprise the steps of: connecting an anode of a first zener diode to a power input terminal of first power switching means such as the first MOSFET power switching device; connecting an anode of a second zener diode to the control terminal of the first power switching means; connecting a cathode of the first zener diode to a cathode of the second zener diode; connecting an anode of a third zener diode to the output terminal of second power switching means such as the second MOSFET power switching device; connecting an anode of a fourth zener diode to the control terminal of the second power switching means; and, connecting a cathode of the third zener diode to a cathode of the fourth zener diode.

It is thus a feature of the present invention to provide improved methods and apparatus for relieving the stresses related to reverse recovery of free-wheeling diodes of power inverter circuits used to drive inductive loads; to provide improved methods and apparatus for relieving the stresses related to reverse recovery of free-wheeling diodes of power inverter circuits used to drive inductive loads by means of saturating inductors connected to switching devices of the power inverter circuits; and, to provide improved methods and apparatus for relieving the stresses related to reverse recovery of free-wheeling diodes of power inverter circuits used to drive inductive loads by connecting saturating inductors and free-wheeling means to switching devices of the power inverter circuits.

Other features and advantages of the invention will be apparent from the following description, the accompanying drawings and the appended claims.

BRIEF DESCRIPTION OF THE DRAWINGS

FIGS. 1-5 are schematic diagrams of five alternate embodiments of circuits for driving inductive loads in accordance with the present invention;

FIG. 6 is a B-H curve for a non-saturable inductor;

FIG. 7 is a B-H curve for a saturable inductor;

FIGS. 8 and 9 are waveforms illustrating operation of a circuit for driving inductive loads without the present invention;

FIGS. 10 and 11 are waveforms illustrating operation of a circuit for driving inductive loads including the present invention and, in particular, constructed in accordance with FIG. 1;

FIGS. 12 and 13 are plan and front views of a preferred structure of the saturable inductors and diodes of the embodiment of the present invention illustrated in FIG. 1;

FIGS. 14 and 15 are sectioned plan and front views of the saturable inductors of FIGS. 12 and 13;

FIG. 16 is a perspective view of a preferred structure for each of the diodes of FIGS. 12 and 13; and FIG. 17 shows a bipolar transistor, in particular an insulated gate bipolar transistor, IGBT, with a back-to-back diode connected thereto.

DETAILED DESCRIPTION OF THE INVENTION

Figure 1:
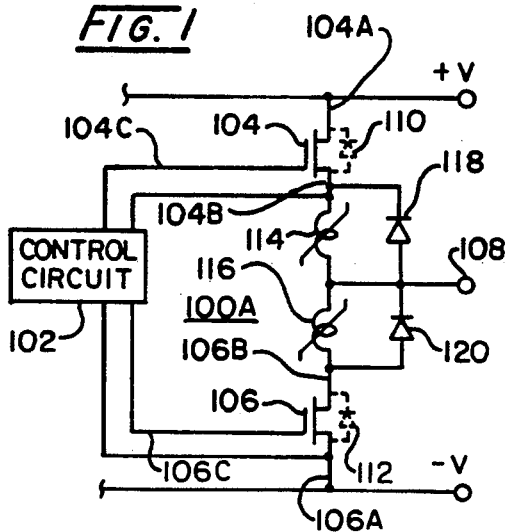

While the present invention is generally applicable to reduce stresses on switching devices used to drive inductive loads, it will be described with reference to pulse width modulated (PWM) inverter systems used to drive alternating current (AC) motors for which it is particularly applicable. For operation of an AC motor from a direct current (DC) power source, a pulse width modulated (PWM) inverter 100 may be used to convert the DC power to AC power for operating the motor. An AC waveform is constructed by the inverter 100 by alternately connecting a positive power bus +V and a negative power bus −V to the motor in accordance with prescribed PWM signals to construct a desired AC waveform.

Schematic diagrams of five alternate embodiments of drive circuits or inverters 100A-100E for driving inductive loads in accordance with the present invention are illustrated in FIGS. 1-5, respectively. Like elements of all of the inverters 100A-100E are identified by the same numerals in each of the FIGS. 1-5. A control circuit 102 alternately connects first and second switching means, comprising power MOSFET devices 104 and 106 in the illustrated embodiments, to a drive terminal 108 which connects the inverters 100A-100E to an inductive load (not shown) such as an AC motor. The first and second switching means or devices may also comprise bipolar transistor devices with discrete diodes connected in back-to-back relationship with the bipolar transistor devices. For example, each of the first and second switching devices can be an IGBT device 109 with a power input terminal 109A, a power output terminal 109B, a control terminal 109C and a free-wheeling discrete diode 109D connected thereto as shown in FIG. 17.

The MOSFET devices 104 each have a first power input terminal 104A connected to the positive power bus +V, a first output terminal 104B and a first control terminal 104C for receiving a switching signal from the control circuit 102 for controlling the conduction of power from the first power input terminal 104A to the first output terminal 104B. The MOSFET devices 106 each have a second power input terminal 106A connected to the negative power bus −V, a second power output terminal 106B and a second control terminal 106C for receiving a switching signal from the control circuit 102 for controlling the conduction of power from the second power input terminal 106A to the second power output terminal 106B.

Since MOSFET devices 104, 106 are used as the inverter transistors in the illustrated embodiments of FIGS. 1-5, free-wheeling diodes 110, 112 are inherently included within the structure of the MOSFET devices 104, 106. A problem arises relative to the reverse recovery times of the free-wheeling diodes 109D, 110, 112, particularly if the diodes have a long reverse recovery time, which is characteristic of the diodes 110, 112 inherent in MOSFET devices 104, 106. The long reverse recovery times of the free-wheeling diodes 110, 112 results in large transient current peaks which can be a source of electrical noise. Further, the voltage applied to a load such as an AC motor changes levels very rapidly which can also be a possible source of electrical noise.

To overcome the problems associated with diode reverse recovery, particularly the slow reverse recovery of the free-wheeling diodes 110, 112, a first saturable inductor 114 is connected between the first output terminal 104B and the drive terminal 108 and a second saturable inductor 116 is connected between the second output terminal 106B and the drive terminal 108. Free-wheeling means is connected to the first and second MOSFET devices 104, 106 for initially conducting free-wheeling current through the load via the drive terminal 108 upon termination of conduction of the first and second switching means, such as the MOSFET devices 104, 106.

The free-wheeling means takes five different forms in the embodiments of the present invention shown in FIGS. 1-5. As shown in FIG. 1, the free-wheeling means comprises a first diode 118 connected in parallel with the first saturable inductor 114 and a second diode 120 connected in parallel with the second saturable inductor 116.

Figure 2:
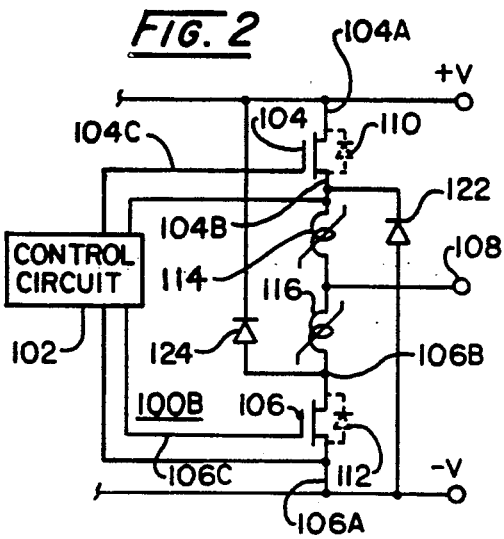

As shown in FIG. 2, the free-wheeling means comprises a first diode 122 having a cathode connected to the first output terminal 104B and an anode connected to the negative power bus −V and a second diode 124 having an anode connected to the second output terminal 106B and a cathode connected to the positive power bus +V.

Figure 3:
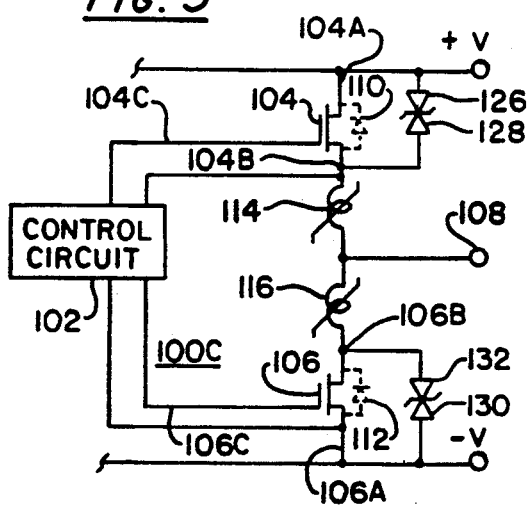

As shown in FIG. 3, the free-wheeling means comprises a first zener diode 126 having an anode connected to the positive power bus +V, a second zener diode 128 having an anode connected to the first output terminal 104B and a cathode connected to the cathode of the first zener diode 126, a third Zener diode 130 having an anode connected to the negative power bus −V, and a fourth zener diode 132 having an anode connected to the second output terminal 106B and a cathode connected to the cathode of the third zener diode 130.

Figure 4:
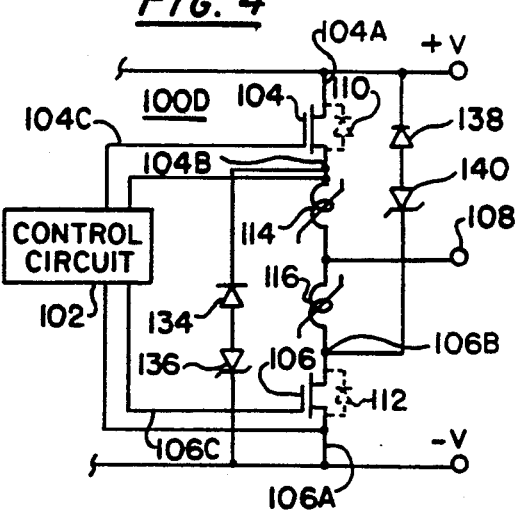

As shown in FIG. 4, the free-wheeling means comprises a first diode 134 having a cathode connected to the first output terminal 104B, a first zener diode 136 having a cathode connected to the negative power bus −V and an anode connected to the anode of the first diode 134, a second diode 138 having a cathode connected to the positive power bus +V, and a second zener diode 140 having a cathode connected to the second output terminal 106B and an anode connected to the anode of the second diode 138.

Finally, as shown in FIG. 5, the free-wheeling means comprises a first zener diode 150 having an anode connected to the first power input terminal 104A, a second zener diode 52 having an anode connected to the first control terminal 104C and a cathode connected to the cathode of the first zener diode 150, a third zener diode 154 having an anode connected to the second output terminal 106B, and a fourth zener diode 156 having an anode connected to the second control terminal 106C and a cathode connected to the cathode of the third zener diode 154.

The first and second saturable inductors 114, 116 are sized to saturate for standard current levels within the drive or inverter circuit 100 but remain unsaturated during reverse recovery of the discrete free-wheeling diodes 109D or the body free-wheeling diodes 110, 112 inherently included within the structure of the MOSFET devices 104, 106. An understanding of the operation of the saturable inductors 114, 116 can be gained by a review of FIGS. 6 and 7. The core material of a non-saturable inductor has B-H characteristics represented by the graph shown in FIG. 6 wherein the inductance of the inductor at any current level, corresponding to H, is given by the slope of the B-H curve. In contrast, the core material of a saturable inductor has a "square loop" B-H curve shown in FIG. 7 wherein the inductance is only significant at current levels that are near zero. For current levels much greater than zero, the inductance is approximately zero.

Thus, the saturable inductors 114, 116 have significant inductance during the time required to perform reverse recovery of the free-wheeling diodes 109D, 110, 112, but once reverse recovery has been accomplished, the saturable inductors 114, 116 are saturated and present substantially zero inductance such that they do not interfere with or influence current flow to the drive terminal 108 and hence the load. As an example of the differing circuit operation without and with saturable inductors/free-wheeling means of the present invention, reference should be made to FIGS. 8–11.

FIGS. 8 and 9 correspond to operation of the drive or inverter circuit 100 without the saturable inductors 114, 116 and one of the associated free-wheeling means described above with $+V = +70$ volts, $-V = -70$ volts, i.e. $V_{BUS} = 140$ volts. FIG. 8 corresponds to the current flow through the body diode or free-wheeling diode 112 as the MOSFET device 104 is turned on after a free-wheeling period. As shown in FIG. 8 the reverse recovery current reaches −15 amps. FIG. 9 corresponds to the voltage across the MOSFET device 106 which goes to a value of 140 volts. Of importance in the present application, the rate of change of the voltage shown in FIG. 9 reaches a maximum of 2 volts/nanosecond.

In contrast, FIGS. 10 and 11 illustrate corresponding waveforms when the invention of the present application is used in the drive or inverter circuit 100, in particular the embodiment of FIG. 1. As can be seen from FIG. 10, the reverse recovery current is reduced to −8 amps and from FIG. 11, the rate of change of the voltage across the MOSFET device 106, saturable inductor 116 and diode 120 is reduced to a maximum of 0.4 volts/nanosecond. The lower rate of change of the voltage also provides additional benefits for the system including a drive circuit including the present invention. For example, in AC motors or other inductive loads driven by a drive circuit including the invention, the life of winding insulation is improved due to reduced heating and electromagnetic interference (EMI) levels are also reduced.

A preferred structure for the saturable inductors 114, 116 and diodes 118, 120 of the embodiment of the present invention shown in FIG. 1 is shown in the FIGS. 12–16. As shown in FIGS. 12–15, the saturable inductors 114, 116 comprise a winding of ⅛" amorphous alloy metal tape T, sold by Allied Signal as amorphous metglas alloy 2741A, which is placed on an epoxy core C which is in turn placed on a ⅛" bar B, see FIGS. 14, 15.

The diodes 118 and 120 preferably each comprise a pair of diodes mounted onto a heat sink. As shown in FIGS. 12, 13 and 16, the diode 118 comprises a 25JPF30, 118A, and a 25CPF30, 118B, which are mounted to a heat sink 142. Interconnection to the diodes 118A and 118B can be by connector pads 118C or otherwise as will be apparent to those skilled in the art. By using a pair of diodes, the voltage across the saturable inductors is increased such that the saturable inductors are reset more quickly. The embodiments of the present invention shown in FIGS. 3–5 also provide faster resetting of the saturable inductors which is important for high frequency operation of the inverter circuits.

While methods in accordance with the present invention should be apparent in view of the foregoing description of the preferred embodiments of apparatus of the invention, the methods will also now be described in the interest of clarity. A method for reducing stress on switching devices in a drive circuit for inductive loads comprising first and second switching means such as the MOSFET switching devices 104, 106 which connect positive and negative power buses +V, −V, respectively, to an inductive load comprises the steps of: connecting a first saturable inductor 114 in series between an output terminal 104B of the first MOSFET power switching device 104 and a drive terminal 108 connected to the inductive load; connecting a second saturable inductor 116 in series between an output terminal 106B of the second MOSFET power switching device 106 and the drive terminal 108 connected to the inductive load; and, coupling free-wheeling means to the first and second MOSFET power switching devices for initial conduction of free-wheeling current through the inductive load upon turn-off of the first and second switching devices.

The step of coupling free-wheeling means to the first and second MOSFET power switching devices may comprise a variety of substeps. Preferably, the step of coupling free-wheeling means to the first and second MOSFET power switching devices 104, 106 comprises the steps of: connecting an anode of a first diode 118 to the drive terminal 108; connecting a cathode of the first diode 118 to the output terminal of the first MOSFET power switching device 104B; connecting a cathode of a second diode 120 to the drive terminal 108; and, connecting an anode of the second diode 120 to the output terminal 106B of the second MOSFET power switching device 106.

The step of coupling free-wheeling means to the first and second MOSFET power switching devices 104, 106 may also comprise the steps of: connecting an anode of a first diode 122 to the negative power bus −V; connecting a cathode of the first diode 120 to the output terminal 104B of the first MOSFET power switching device 104; connecting an anode of a second diode 124 to the output terminal 106B of the second MOSFET power switching device 106; and, connecting a cathode of the second diode 124 to the positive power bus +V.

The step of coupling free-wheeling means to the first and second MOSFET power switching devices 104, 106 may alternately comprise the steps of: connecting an anode of a first zener diode 126 to the positive power bus +V; connecting an anode of a second zener diode 128 to the output terminal 104B of the first MOSFET power switching device 104; connecting the cathode of the first zener diode to the cathode of the second Zener diode 128; connecting an anode of a third zener diode 130 to the negative power bus −V; connecting an anode of a fourth zener diode 132 to the output terminal 106B of the second MOSFET power switching device 106; and, connecting the cathode of the third zener diode 130 to the cathode of the fourth zener diode 132.

The step of coupling free-wheeling means to the first and second MOSFET power switching devices 104, 106 may comprise the steps of: connecting a cathode of a first diode 134 to the output terminal 104B of the first MOSFET power switching device 104; connecting a cathode of a first zener diode 136 to the negative power bus −V; connecting an anode of the first diode 134 to the anode of the first zener diode 136; connecting a cathode of a second diode 138 to the positive power bus +V; connecting a cathode of a second zener diode 140 to the output terminal 106B of the second MOSFET power switching device 106; and, connecting the anode of the second diode 138 to the anode of the second zener diode 140.

Finally, the step of coupling free-wheeling means to the first and second MOSFET power switching devices 104, 106 may alternately comprise the steps of: connecting an anode of a first zener diode 150 to an input terminal 104A of the first MOSFET power switching device 104; connecting an anode of a second zener diode 152 to a control terminal 104C of the first MOSFET power switching device 104; connecting the cathode of the first zener diode 150 to the cathode of the second zener diode 152; connecting an anode of a third zener diode 154 to the output terminal 106B of the second MOSFET power switching device 106; connecting an anode of a fourth zener diode 156 to the control terminal 106C of the second MOSFET power switching device 106; and, connecting the cathode of the third zener diode 154 to the cathode of the fourth zener diode 156.

Similar steps are performed when bipolar transistors and discrete free-wheeling diodes, such as the IGBT device 109 and the diode 109D of FIG. 17, are used as the switching means instead of MOSFET power switching devices.

Having thus described the methods and apparatus of the present invention in detail and by reference to preferred embodiments thereof, it will be apparent that modifications and variations are possible without departing from the scope of the invention defined in the appended claims.

What is claimed is:

1. A drive circuit for inductive loads comprising:
first and second switching means comprising power MOSFET devices for connecting power to a load, said first switching means having an first power unit terminal connected to a positive power bus, a first power output terminal and a first control terminal for receiving a switching signal controlling the conduction of power from said first power input terminal to said first power output terminal, said second switching means having a second power input terminal connected to a negative power bus, a second power output terminal and a second control terminal for receiving a switching signal controlling the conduction of power from said second power input terminal to said second power output terminal;
a drive terminal for connecting said drive circuit to a load;
a first saturable inductor connected between said first power output terminal and said drive terminal, said first saturable inductor being sized to saturate for standard current levels within the drive circuit but remain unsaturated during reverse recovery of body diodes inherently included within the structure of said power MOSFET devices;
a second saturable inductor connected between said second power output terminal and said drive terminal, said second saturable inductor being sized to saturate for standard current levels within the drive circuit but remain unsaturated during reverse recovery of body diodes inherently included within the structure of said power MOSFET devices; and
free-wheeling means connected to said first and second switching means for initially conducting free-wheeling current through said load upon termination of conduction of said first and second switching means, said free-wheeling means comprising:
a first diode connected in parallel with said first saturable inductor and having an anode connected to said drive terminal and a cathode connected to said first power output terminal; and
a second diode connected in parallel with said second saturable inductor and having a cathode connected to said drive terminal and an anode connected to said second power output terminal.

2. A drive circuit for inductive loads comprising:
first and second switching means comprising power MOSFET devices for connecting power to a load, said first switching means having a first power input terminal connected to a positive power bus, a first power output terminal and a first control terminal for receiving a switching signal controlling the conduction of power from said first power input terminal to said first power output terminal, said second switching means having a second power input terminal connected to a negative power bus, a second power output terminal and a second control terminal for receiving a switching signal controlling the conduction of power from said second power input terminal to said second power output terminal;
a drive terminal for connecting said drive circuit to a load;
a first saturable inductor connected between said first power output terminal and said drive terminal, said first saturable inductor being sized to saturate for standard current levels within the drive circuit but remain unsaturated during reverse recovery of body diodes inherently included within the structure of said power MOSFET devices;

a second saturable inductor connected between said second power output terminal and said drive terminal, said second saturable inductor being sized to saturate for standard current levels within the drive circuit but remain unsaturated during reverse recovery of body diodes inherently included within the structure of said power MOSFET devices; and free-wheeling means connected to said first and second switching means for initially conducting free-wheeling current through said load upon termination of conduction of said first and second switching means, said free-wheeling means comprising:

a first diode having a cathode connected to said first power output terminal and an anode connected to said negative power bus; and a second diode having an anode connected to said second power output terminal and a cathode connected to said positive power bus.

3. A drive circuit for inductive loads comprising:

first and second switching means comprising power MOSFET devices for connecting power to a load, said first switching means having a first power input terminal connected to a positive power bus, a first power output terminal and a first control terminal for receiving a switching signal controlling the conduction of power from said first power input terminal to said first power output terminal, said second switching means having a second power input terminal connected to a negative power bus, a second power output terminal and a second control terminal for receiving a switching signal controlling the conduction of power from said second power input terminal to said second power output terminal;

a drive terminal for connecting said drive circuit to a load;

a first saturable inductor connected between said first power output terminal and said drive terminal, said first saturable inductor being sized to saturate for standard current levels within the drive circuit but remain unsaturated during reverse recovery of body diodes inherently included within the structure of said power MOSFET devices;

a second saturable inductor connected between said second power output terminal and said drive terminal, said second saturable inductor being sized to saturate for standard current levels within the drive circuit but remain unsaturated during reverse recovery of body diodes inherently included within the structure of said power MOSFET devices; and free-wheeling means connected to said first and second switching means for initially conducting free-wheeling current through said load upon termination of conduction of said first and second switching means, said free-wheeling means comprising:

a first zener diode having an anode connected to said positive power bus and a cathode;

a second zener diode having an anode connected to said first power output terminal and a cathode connected to the cathode of said first zener diode;

a third zener diode having an anode connected to said negative power bus and a cathode; and a fourth zener diode having an anode connected to said second power output terminal and a cathode connected to the cathode of said third zener diode.

4. A drive circuit for inductive loads comprising:

first and second switching means comprising power MOSFET devices for connecting power to a load, said first switching means having a first power input terminal connected to a positive power bus, a first power output terminal and a first control terminal for receiving a switching signal controlling the conduction of power from said first power input terminal to said first power output terminal, said second switching means having a second power input terminal connected to a negative power bus, a second power output terminal and a second control terminal for receiving a switching signal controlling the conduction of power from said second power input terminal to said second power output terminal;

a drive terminal for connecting said drive circuit to a load;

a first saturable inductor connected between said first power output terminal and said drive terminal, said first saturable inductor being sized to saturate for standard current levels within the drive circuit but remain unsaturated during reverse recovery of body diodes inherently included within the structure of said power MOSFET devices;

a second saturable inductor connected between said second power output terminal and said drive terminal, said second saturable inductor being sized to saturate for standard current levels within the drive circuit but remain unsaturated during reverse recovery of body diodes inherently included within the structure of said power MOSFET devices; and free-wheeling means connected to said first and second switching means for initially conducting free-wheeling current through said load upon termination of conduction of said first and second switching means, said free-wheeling means comprising:

a first diode having a cathode connected to said first power output terminal and an anode;

a first zener diode having a cathode connected to said negative power bus and an anode connected to the anode of said first diode;

a second diode having a cathode connected to said positive power bus and an anode; and a second zener diode having a cathode connected to said second power output terminal and an anode connected to the anode of said second diode.

5. A drive circuit for inductive loads comprising:

first and second switching means comprising power MOSFET devices for connecting power to a load, said first switching means having a first power input terminal connected to a positive power bus, a first power output terminal and a first control terminal for receiving a switching signal controlling the conduction of power from said first power input terminal to said first power output terminal, said second switching means having a second power input terminal connected to a negative power bus, a second power output terminal and a second control terminal for receiving a switching signal controlling the conduction of power from said second power input terminal to said second power output terminal;

a drive terminal for connecting said drive circuit to a load;

a first saturable inductor sized for standard current levels within the drive circuit but remain unsaturated during reverse recovery of body diodes inherently included within the structure of said power MOSFET devices connected between said first power output terminal and said drive terminal;

a second saturable inductor sized to saturate for standard current levels within the drive circuit but remain unsaturated during reverse recovery of body diodes inherently included within the structure of said power MOSFET devices connected between said second power output terminal and said drive terminal; and free-wheeling means connected to said first and second switching means for initially conducting free-wheeling current through said load upon termination of conduction of said first and second switching means, said free-wheeling means comprising:

a first zener diode having an anode connected to said first power input terminal and a cathode;

a second zener diode having an anode connected to said first control terminal and a cathode connected to the cathode of said first zener diode;

a third zener diode having an anode connected to said second power output terminal and a cathode; and a fourth zener diode having an anode connected to said second control terminal and a cathode connected to the cathode of said third zener diode.

6. A drive circuit for inductive loads comprising:

first and second switching means comprising bipolar transistor devices with discrete diodes connected in back-to-back relationship therewith for connecting power to a load, said first switching means having a first power input terminal connected to a positive power bus, a first power output terminal and a first control terminal for receiving a switching signal controlling the conduction of power from said first power input terminal to said first power output terminal, said second switching means having a second power input terminal connected to a negative power bus, a second power output terminal and a second control terminal for receiving a switching signal controlling the conduction of power from said second power input terminal to said second power output terminal;

a drive terminal for connecting said drive circuit to a load;

a first saturable inductor connected between said first power output terminal and said drive terminal, said first saturable inductor being sized to saturate for standard current levels within the drive circuit but remain unsaturated during reverse recovery of said discrete diodes;

a second saturable inductor connected between said second power output terminal and said drive terminal, said second saturable inductor being sized to saturate for standard current levels within the drive circuit but remain unsaturated during reverse recovery of said discrete diodes; and free-wheeling means connected to said first and second switching means for initially conducting free-wheeling current through said load upon termination of conduction of said first and second switching means, said free-wheeling means comprising:

a first diode connected in parallel with said first saturable inductor and having an anode connected to said drive terminal and a cathode connected to said first power output terminal; and a second diode connected in parallel with said second saturable inductor and having a cathode connected to said drive terminal and an anode connected to said second power output terminal.

7. A drive circuit for inductive loads comprising:

first and second switching means comprising bipolar transistor devices with discrete diodes connected in back-to-back relationship therewith for connecting power to a load, said first switching means having a first power input terminal connected to a positive power bus, a first power output terminal and a first control terminal for receiving a switching signal controlling the conduction of power from said first power input terminal to said first power output terminal, said second switching means having a second power input terminal connected to a negative power bus, a second power output terminal and a second control terminal for receiving a switching signal controlling the conduction of power from said second power input terminal to said second power output terminal;

a drive terminal for connecting said drive circuit to a load;

a first saturable inductor connected between said first power output terminal and said drive terminal, said first saturable inductor being sized to saturate for standard current levels within the drive circuit but remain unsaturated during reverse recovery of said discrete diodes;

a second saturable inductor connected between said second power output terminal and said drive terminal, said second saturable inductor being sized to saturate for standard current levels within the drive circuit but remain unsaturated during reverse recovery of said discrete diodes; and free-wheeling means connected to said first and second switching means for initially conducting free-wheeling current through said load upon termination of conduction of said first and second switching means, said free-wheeling means comprising:

a first diode having a cathode connected to said first power output terminal and an anode connected to said negative power bus; and a second diode having an anode connected to said power output terminal and a cathode connected to said positive power bus.

8. A drive circuit for inductive loads comprising:

first and second switching means comprising bipolar transistor devices with discrete diodes connected in back-to-back relationship therewith for connecting power to a load, said first switching means having a first power input terminal connected to a positive power bus, a first power output terminal and a first control terminal for receiving a switching signal controlling the conduction of power from said first power input terminal to said first power output terminal, said second switching means having a second power input terminal connected to a negative power bus, a second power output terminal and a second control terminal for receiving a switching signal controlling the conduction of power from said second power input terminal to said second power output terminal;

a drive terminal for connecting said drive circuit to a load;

a first saturable inductor connected between said first power output terminal and said drive terminal, said first saturable inductor being sized to saturate for standard current levels within the drive circuit but remain unsaturated during reverse recovery of said discrete diodes;

a second saturable inductor connected between said second power output terminal and said drive terminal, said second saturable inductor being sized to saturate for standard current levels within the drive circuit but remain unsaturated during reverse recovery of said discrete diodes; and free-wheeling means connected to said first and second switching means for initially conducting free-wheeling current through said load upon termination of conduction of said first and second switching means, said free-wheeling means comprising:

a first zener diode having an anode connected to said positive power bus and a cathode;

a second zener diode having an anode connected to said first power output terminal and a cathode connected to the cathode of said first zener diode;

a third zener diode having an anode connected to said negative bus power and a cathode; and a fourth zener diode having an anode connected to said second power output terminal and a cathode connected to the cathode of said third zener diode.

9. A drive circuit for inductive loads comprising:

first and second switching means comprising bipolar transistor devices with discrete diodes connected in back-to-back relationship therewith for connecting power to a load, said first switching means having a first power input terminal connected to a positive power bus, a first power output terminal and a first control terminal for receiving a switching signal controlling the conduction of power from said first power input terminal to said first power output terminal, said second switching means having a second power input terminal connected to a negative power bus, a second power output terminal and a second control terminal for receiving a switching signal controlling the conduction of power from said second power input terminal to said second power output terminal;

a drive terminal for connecting said drive circuit to a load;

a first saturable inductor connected between said first power output terminal and said drive terminal, said first saturable inductor being sized to saturate for standard current levels within the drive circuit but remain unsaturated during reverse recovery of said discrete diodes;

a second saturable inductor connected between said second power output terminal and said drive terminal, said second saturable inductor being sized to saturate for standard current levels within the drive circuit but remain unsaturated during reverse recovery of said discrete diodes; and free-wheeling means connected to said first and second switching means for initially conducting free-wheeling current through said load upon termination of conduction of said first and second switching means, said free-wheeling means comprising:

a first diode having a cathode connected to said first power output terminal and an anode;

a first zener diode having a cathode connected to said negative power bus and an anode connected to the anode of said first diode;

a second diode having a cathode connected to said positive bus power and an anode; and a second zener diode having a cathode connected to said second power output terminal and an anode connected to the anode of said second diode.

10. A drive circuit for inductive loads comprising:

first and second switching means comprising bipolar transistor devices with discrete diodes connected in back-to-back relationship therewith for connecting power to a load, said first switching means having a first power input terminal connected to a positive power bus, a first power output terminal and a first control terminal for receiving a switching signal controlling the conduction of power from said first power input terminal to said first power output terminal, said second switching means having a second power input terminal connected to a negative power bus, a second power output terminal and a second control terminal for receiving a switching signal controlling the conduction of power from said second power input terminal to said second power output terminal;

a drive terminal for connecting said drive circuit to a load;

a first saturable inductor connected between said first power output terminal and said drive terminal, said first saturable inductor being sized to saturate for standard current levels within the drive circuit but remain unsaturated during reverse recovery of said discrete diodes;

a second saturable inductor connected between said second power output terminal and said drive terminal, said second saturable inductor being sized to saturate for standard current levels within the drive circuit but remain unsaturated during reverse recovery of said discrete diodes; and free-wheeling means connected to said first and second switching means for initially conducting free-wheeling current through said load upon termination of conduction of said first and second switching means, said free-wheeling means comprising:

a first zener diode having an anode connected to said first power input terminal and a cathode;

a second zener diode having an anode connected to said first control terminal and a cathode connected to the cathode of said first zener diode;

a third zener diode having an anode connected to said second power output terminal and a cathode; and a fourth zener diode having an anode connected to said second control terminal and a cathode connected to the cathode of said third zener diode.

* * * * *

UNITED STATES PATENT AND TRADEMARK OFFICE
CERTIFICATE OF CORRECTION

PATENT NO. : 5,202,820
DATED : April 13, 1993
INVENTOR(S) : John M. Miller

It is certified that error appears in the above-identified patent and that said Letters Patent is hereby corrected as shown below:

Col. 10, line 4, "power unit terminal" should be --power input terminal--.

Col. 14, lines 47-48, "to said power" should be --to said second power--.

Col. 16, line 10, "positive bus power" should be --positive power bus--.

Signed and Sealed this

Eleventh Day of January, 1994

BRUCE LEHMAN

*Attest:*

*Attesting Officer*     *Commissioner of Patents and Trademarks*